METALLIC LINER FOR PRINTED CIRCUIT BOARD HOLE

Filed July 30, 1968 2 Sheets-Sheet 1

Dec. 15, 1970 W. J. GARVER 3,548,369

METALLIC LINER FOR PRINTED CIRCUIT BOARD HOLE

Filed July 30, 1968 2 Sheets-Sheet 2

United States Patent Office 3,548,369

Patented Dec. 15, 1970

3,548,369

METALLIC LINER FOR PRINTED CIRCUIT BOARD HOLE

William Joseph Garver, Harrisburg, Pa., assignor to AMP Incorporated, Harrisburg, Pa.

Filed July 30, 1968, Ser. No. 748,694

Int. Cl. H01r *11/06;* H05k *1/04*

U.S. Cl. 339—258 4 Claims

ABSTRACT OF THE DISCLOSURE

Sheet metal liner for a hole in a printed circuit board comprises generally cylindrical member which is tapered from one end towards the other end, the one end having a substantially greater maximum transverse dimension than the other end. A retaining member is integral with the wall of the liner adjacent to the one end and is inclined inwardly towards the axis of the liner. The end portion of this retaining member is reversely bent to define a laterally extending ear. In use, the liner is mounted in the hole of a printed circuit board and a lead wire from a component is inserted into the liner and against the retaining member. The insertion of the lead wire causes the retaining member to move outwardly so that it holds the lead wire against the opposite internal wall of the liner. The ear, on the end of the retaining member, is moved beyond the edge of the hole in the printed circuit board and functions to retain the liner in the hole. The lead wire is subsequently soldered to the liner and to a conductor on the printed circuit board by soldering.

BACKGROUND OF THE INVENTION

It is common practice, in the art of manufacturing printed circuit boards, to provide holes in the boards for the reception of the lead wires from the components on the board. The wires are then soldered to the conductors on the underside of the board to form the electrical connections between the conductors and the leads. It is also desirable to provide metallic liners for the printed circuit board holes which function to promote the dip-soldering operation in that they facilitate the wicking of the solder into the hole, i.e., they promote the capillary action of the solder, so that a sound connection will be formed between the leads and the printed circuit board conductors. It is desirable if these printed circuit board hole liners can be made such that they will perform the additional function of temporarily retaining a lead wire prior to, and during, the soldering operation to permit the necessary handling of the printed circuit board during the soldering operation.

It has been common practice in the past to insert liners into the holes of printed circuit boards by conventional inserting machines similar to eye-letting machines but this method is relatively slow and expensive because of the random locations of the holes in the boards and because of the large number of holes in an individual printed circuit board. More recently, it has been proposed that the liners might be inserted into printed circuit board holes by merely providing an excess of liners on the surface of a templet, vibrating the templet until a liner enters each hole of the templet, and then pushing liners from the templet holes into the printed circuit board holes. If conventional prior art liners are used for this assembly method, several problems are encountered. For example, it has been found that some of the liners will be improperly oriented in the templet holes, that is, they will fall into the holes upside down, and/or, two or more liners may nest within each other in a single hole.

The instant invention is addressed to the provision of an improved printed circuit board hole liner which is particularly adapted to be inserted into a hole in a printed circuit board by a vibration assembly process. It is accordingly an object of the invention to provide an improved liner for a printed circuit board hole. A further object is to provide a printed circuit board hole liner which can be assembled to a printed circuit board hole by a vibration assembly process and which will overcome previously encountered problems such as the nesting of the liners in the holes, failure to achieve substantially complete filling of the holes during the vibration assembly process, and improper orientation of the liners in the holes. It is a further object of the invention to provide a printed circuit board hole liner having the capability of temporarily retaining an inserted lead wire from a component prior to the soldering operation thereby to permit handling of the board during the assembly process and during the soldering operation.

These and other objects of the invention are achieved in a preferred embodiment comprising a generally cylindrical sheet metal liner which has an oval-shaped cross-section at one end thereof and which tapers to a generally circular cross-section at its other end. The oval-shaped cross-section has a transverse dimension which is substantially greater than the diameter of the other end of the liner so that when an excess of liners are placed on the surface of a templet and the templet is vibrated, the liners will enter templet holes with their smaller diameter ends facing downwardly. When the templet is later positioned above a printed circuit board hole and the liners are pushed from the templet holes into the printed circuit board holes, the liners will be properly positioned for reception of the lead wires from the components which are to be mounted on the board. A retaining member is formed integral with the liner adjacent to the upper end, which has the largest transverse dimension, and extends inwardly towards, and past, the liner axis. The end portion of this retaining member is reversely bent to define a laterally extending ear. After liners in accordance with the invention have been inserted into all of the holes in a printed circuit board, the lead wires from the components, which are to be mounted on the board, can be inserted through the liners and will bend these retaining members outwardly. The retaining members will resiliently bear, at their bends, against the lead wires and temporarily retain the leads in the printed circuit board holes. The ears, on the ends of the retaining members, will also be moved outwardly beyond the edges of the holes by the lead wires and will function as retainers to hold the liners in the holes until the dip-soldering operations are carried out.

Figures 8, 9, 10, 11, 12:
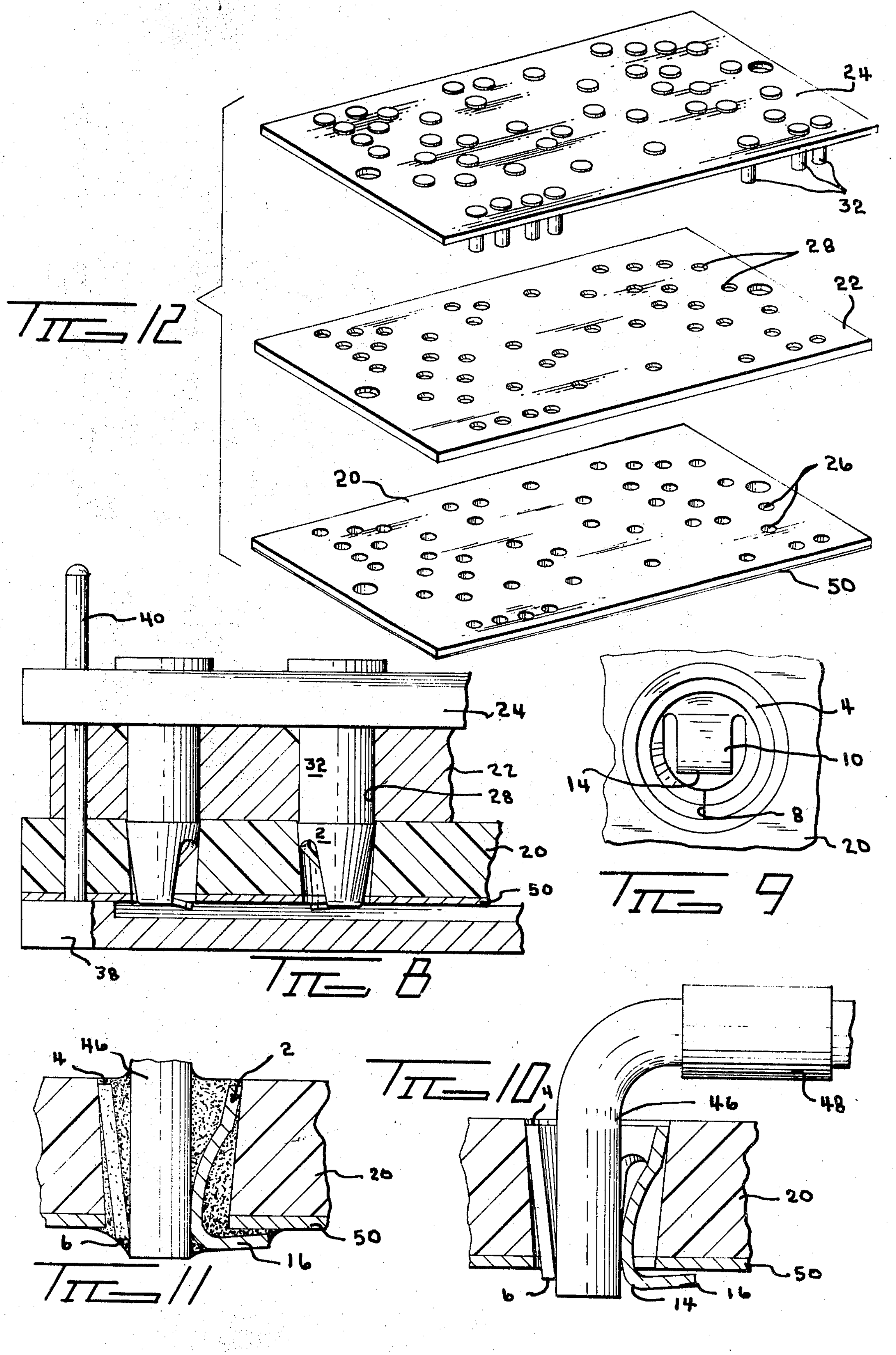
FIG. 8 is a view similar to FIG. 7 but showing the positions of the parts after insertion of the liners into the holes in the printed circuit board.
FIG. 9 is a plan view of a portion of the surface of a printed circuit board having a liner in accordance with the invention mounted in a printed circuit board hole.
FIG. 10 is a sectional side view of a portion of a printed circuit board having a liner in accordance with the invention mounted therein and having a lead wire from a component inserted into the liner.

FIG. 11 is a view similar to FIG. 10 but illustrating the appearance of the parts after the dip-soldering operation has been carried out; and FIG. 12 is a perspective exploded view showing a typical printed circuit board, a templet adapted to be used with the printed circuit board for insertion of liners into the holes of the board, and a punch plate having punches thereon for driving the liners from the templet into the printed circuit board.

A preferred form of printed circuit board hole liner 2 in accordance with the invention comprises a generally tubular sheet metal member which has an oval-shaped cross-section at one end 4, and a substantially circular cross-section 6 at its other end, the maximum transverse dimension of the oval-shaped end 4 being substantially greater than the diameter of the circular end 6. The liner is manufactured from relatively thin sheet metal, for example, 0.005 inch in thickness, and has an axially extending seam 8, which is preferably left open by an amount which is equal to, or less than, the thickness of the metal stock for reasons which will be explained below. A finger-like retaining member 10 is integral with the liner at a location 12 adjacent to the oval-shaped end 4. This retaining member extends abruptly obliquely towards the axis of the liner and is reversely bent as shown at 14 adjacent to the end 6 to define a laterally extending ear 16. As is apparent from FIG. 4, the developed length of this retaining member is substantially greater than the length of the liner and the retaining member is formed by blanking out material, indicated at 18 in FIG. 4, from the metal stock. By virtue of the fact that a substantial amount of metal stock is removed at 18 on each side of the retaining member 10, the retaining member itself is free to move radially outwardly when the liner is mounted in a printed circuit board hole and a lead wire from a component is inserted as will be expiained below.

Figures 1, 2, 3, 4, 5, 6, 7:
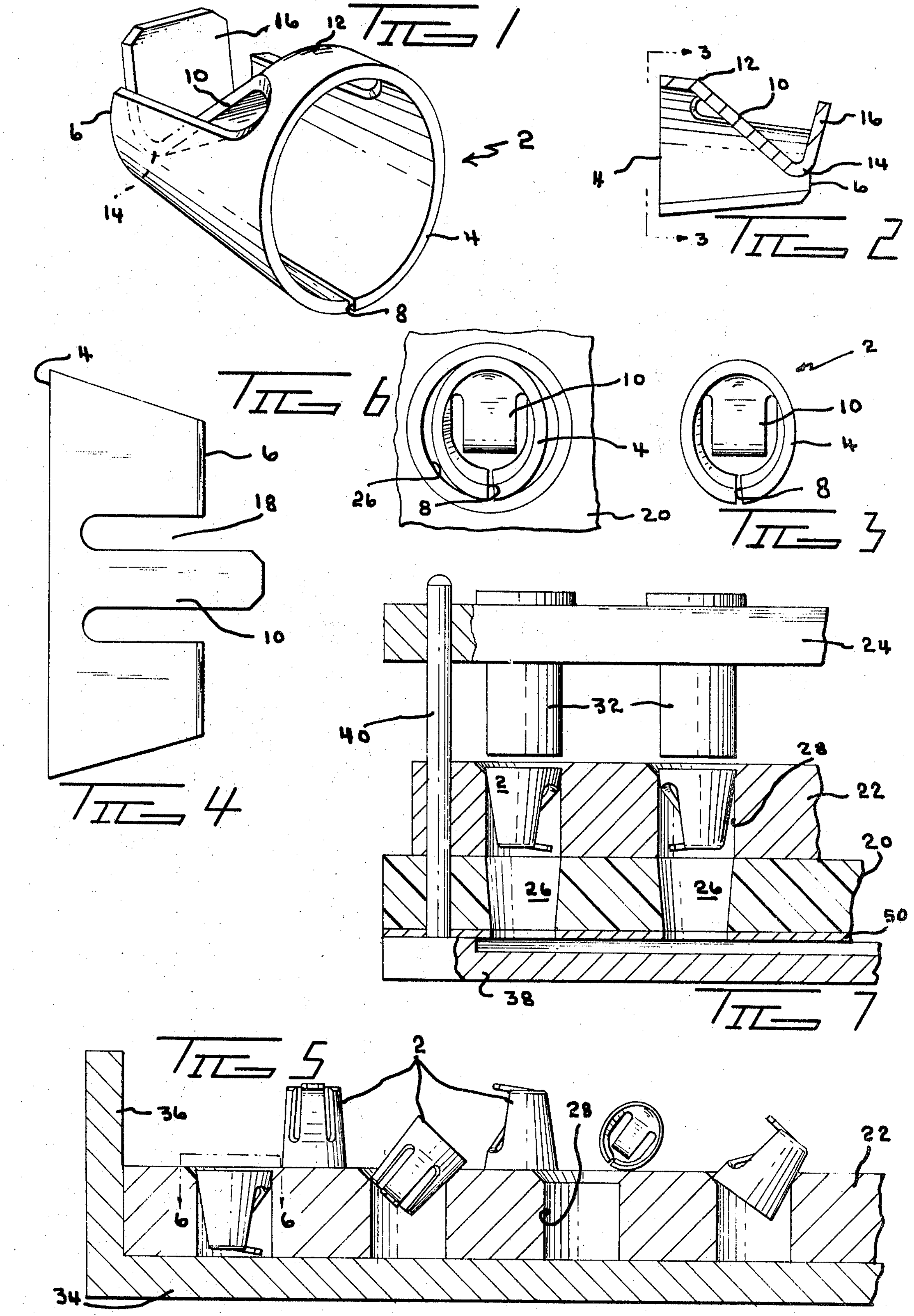
FIG. 1 is a perspective view of a printed circuit board hole liner in accordance with the invention.
FIG. 2 is a sectional side view of a liner shown in FIG. 1.
FIG. 3 is an end view of the preferred form of liner looking in the direction of the arrows 3—3 of FIG. 2.
FIG. 4 is a plan view of a sheet metal blank from which a liner in accordance with the invention is formed.
FIG. 5 is a fragmentary sectional side view, on an enlarged scale, illustrating the manner in which liners in accordance with the invention can be inserted into holes in a templet.
FIG. 6 is a view taken along the lines 6—6 of FIG. 5.
FIG. 7 is a fragmentary sectional side view showing the templet, shown in FIG. 5, mounted above a printed circuit board and showing a punch plate mounted above the templet, this view showing the positions of the parts immediately prior to insertion of the liners contained in the templet into the printed circuit board.

As explained in the co-pending application of Willard L. Busler et al., Ser. No. 811,269 filed Feb. 12, 1969, liners of the type shown in FIGS. 1–3 are advantageously inserted into the holes of a printed circuit board 20 by means of a templet 22 having holes 28 at locations corresponding to the locations of the holes 26 in the printed circuit board, and a punch plate 24 having punches 32 at locations corresponding to the locations of the holes in the templet in the printed circuit board. The holes 28 in the templet are bevelled at their upper ends as shown in FIG. 5 and have a diameter which is substantially equal to the maximum transverse dimension, that is, the major axis, of the oval-shaped end of the liner. The printed circuit board holes 26 are substantially circular although they may flair outwardly at their upper ends as shown in FIG. 7. The cross-sectional configuration of the printed circuit board holes as shown in FIG. 7 is an inherent result of the punching operation which tends to remove, by tearing out, some material at the upper end of each hole. The diameter of these holes in the printed circuit board is such that when a liner is forced into a hole, the large diameter end 4 of the liner has a force-fit in the hole.

When it is desired to fill all of the holes 26 of the printed circuit board with liners, the templet 28 is first placed in a suitable support 34 (FIG. 5) having fence-like sidewalls 36 and an excess of liners 2 are positioned on the upper surface of the templet. The plate 34 is then vibrated at a frequency of about 60 c.p.s. until all of the holes in the templet contain a single liner. By virtue of the shape of the liners 2 and particularly by virtue of the relatively large transverse dimension at the ends 6 of the liners, the liners will always enter the holes with their circular ends facing downwardly as shown in FIG. 5. If a liner should attempt to enter one of the templet holes in the opposite attitude (as indicated by the liner located at the extreme right in FIG. 5), it will be prevented from entering the hole because of its transverse dimension and will subsequently be bounced out of the hole.

As shown in FIG. 6, the liners retain their oval-shaped cross-section at the upper end 6 after they are mounted in the templet holes but will be retained in these holes by a light force-fit which retains them sufficiently to permit handling of the templet for the subsequent operations.

The printed circuit board is placed on a support plate 38 (FIGS. 7 and 8) having locating pins 40 extending from its upper surface at opposite ends thereof. The printed circuit board and the templet are provided with holes which are adapted to receive these pins so that when the printed circuit board and the templet are mounted on the fixture plate 38 as shown in FIG. 7, the holes in the templet will be in precise alignment with the holes in the printed circuit board. The punch plate 24 is then mounted on the pins so that the punches on the underside of this plate are in alignment with the templet holes and the printed circuit board holes. The punch plate is then moved downwardly from the position of FIG. 7 to the position of FIG. 8 and the punches drive the individual liners from the templet holes into the printed circuit board holes. The individual liners are resiliently reformed during this step of the process so that their oval-shaped ends become substantially circular as indicated in FIG. 9 and the open seam 8 may be entirely closed if it mas not closed when the liners were inserted into the templet holes. The interference fit at the upper end of each liner between its end 6 and the upper end of the printed circuit board hole is sufficient not only to retain the liners in the holes but to permit insertion of a wire 46 from a component 48 as will be explained below.

The templet, the punch plate, and the printed circuit board are then removed from the fixture plate 38 and the components 48 having leads 46 are mounted on the board by inserting the lead wires through the desired holes and through the liners contained in these holes. As shown in FIG. 10, these holes will ordinarily intersect a conductor 50 on the underside of the printed circuit board so that when the board is subsequently dip-soldered, the lead wires will be electrically connected to these conductors. As also shown in FIG. 10, when the wire 46 is inserted into a liner, it moves the ear 16 of the retaining member laterally by a substantial distance so that this ear is moved beyond the edge of the hole. After such displacement of the retaining member, the liner is securely held against upward movement as will be apparent from FIG. 10. As previously noted, the liners have a force-fit in the holes and this force-fit coupled with the slight taper in the upper ends of the printed circuit board holes retains them against relative downward movement. The component wires 46 are securely retained in the liners by virtue of the spring-back effect of the individual retainers which bear against the inserted component wires and holds them against the opposite walls of the liners. Upon subsequent solder-dipping of the printed circuit board, a permanent electrical connection is obtained between the wires 46 and the conductors 50 as indicated in FIG. 11.

A significant advantage of a printed circuit board hole liner in accordance with the invention is the adaptability of the liner to assemble to the printed circuit board by vibration as indicated in FIGS. 5–8. The liner 2 can not enter the templet hole in an improper orientation, that is, with its large end facing downwardly because of the difference in dimensions between its ends 4, 6 although it will readily enter the hole with its small end facing downwardly. By virtue of the larger transverse dimension of the major axis of the end 4, the liner will be retained in the templet holes with sufficient tenacity to permit handling of the templet during transference to the fixture plate 38. It should also be noted that added length of the retaining member 10 has the effect of locating the center of gravity of the liner closer to the end 6 than to the end 4. By virtue of this fact, the liners in FIG. 5 have a strong tendency to drop into the templet holes with their circular ends 6 facing downwardly and have a lesser tendency to fall into the holes (as with the liner at the extreme right in FIG. 5) with the large ends disposed or facing downwardly. An additional advantage achieved during the vibration by the retaining member 16 is that the laterally extending ear 16 of the retaining member 10 tends to prevent nesting or stacking of one liner on top of another in a single templet hole. It can readily be perceived that a simple tubular liner would have a much greater tendency to nest or stack than do liners having this laterally extending surface provided by the ear 16 which functions as a stop.

The structural features of the liners in accordance with the invention which facilitate the positioning of the liners in the templet holes during vibration also contribute substantially to the effectiveness of the liner after it has been mounted in the printed circuit board hole. After the wires 46 are inserted into the liners, the ears 16 are moved outwardly to function as stops preventing upward movement of the liners relative to the holes so that liners can not be removed or will not drop out during handling preceeding the solder-dipping operation. The component lead wires 46 will also be firmly retained in the liners because of the gripping effect of the retainers when they are bent or flexed outwardly by the lead wires.

A relatively wide range of lead wire sizes or diameters can be accommodated with a liner if given carefully selected dimensions. The precise dimensions of a liner manufactured in accordance with the invention will, of course, depend upon numerous considerations such as the diameter of the printed circuit board holes and the diameters of the lead wires which are to be accommodated. The following dimensions for a liner for a printed circuit board hole having a diameter at its upper end about 0.057 inch have been found to give good results for wire diameters in the range of 0.015 inch to 0.035 inch.

| | Inches |
|---|---|
| Major axis dimension of large end of liner | 0.064 |
| Minor axis dimension of large end of liner | 0.052 |
| Diameter of small end of liner | 0.048 |
| Length of liner | 0.068 |
| Developed length of retainer as measured from the large end of liner | 0.095 |
| Width of retainer | 0.025 |
| Stock thickness and material | [1] 0.005 |

[1] Temper 10 brass.

Changes in construction will occur to those skilled in the art and various apparently different modifications and embodiments may be made without departing from the scope of the invention. The matter set forth in the foregoing description and accompanying drawings is offered by way of illustration only.

What is claimed is:

1. A liner for a printed circuit board hole comprising:
a rolled up sheet metal sleeve having an axially extending open seam,
said sleeve being tapered from a smaller end thereof to a larger end, said larger end being generally oval shaped and having a major axis and a minor axis, said major axis having a length which is greater than the diameter of said hole and said minor axis having a length which is less than the diameter of said hole,
a retaining member struck from the wall of said sleeve, said retaining member having a fixed end which is integral with said liner adjacent said larger diameter end and a free end which is adjacent to said smaller diameter end, said retaining member extending obliquely inwardly relative to the wall of said liner from said fixed end to said free end,
said free end being bent to define a laterally extending ear adapted to engage the underside of a printed circuit board upon lateral movement of said retaining member away from the axis of said liner.

2. A liner as set forth in claim 1 wherein said open seam has a width which is less than the thickness of the sheet metal of said liner.

3. A liner as set forth in claim 1 wherein said retaining member has a developed length which is greater than the length of said liner.

4. A liner as set forth in claim 1 wherein said smaller diameter end is circular.

References Cited

UNITED STATES PATENTS

| | | | |
|---|---|---|---|
| 2,599,488 | 6/1952 | Sampson | 339—219 |
| 2,730,690 | 1/1956 | Harasek | 339—17X |
| 2,967,285 | 1/1961 | Freitas | 339—221(M)X |
| 3,156,517 | 11/1964 | Maximoff et al. | 339—275(B) |

FOREIGN PATENTS

| | | | |
|---|---|---|---|
| 657,838 | 9/1951 | Great Britain | 339—258P |

MARVIN A. CHAMPION, Primary Examiner

P. A. CLIFFORD, Assistant Examiner

U.S. Cl. X.R.

339—17, 221; 29—625